United States Patent
Lin et al.

(10) Patent No.: US 10,651,352 B2
(45) Date of Patent: May 12, 2020

(54) DISPLAY DEVICE AND ELECTRONIC DEVICE

(71) Applicant: InnoLux Corporation, Miao-Li County (TW)

(72) Inventors: Chun-Hsien Lin, Miao-Li County (TW); Geng-Fu Chang, Miao-Li County (TW); Jui-Feng Ko, Miao-Li County (TW); Tsau-Hua Hsieh, Miao-Li County (TW); Shu-Ming Kuo, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/129,197

(22) Filed: Sep. 12, 2018

(65) Prior Publication Data

US 2019/0115508 A1 Apr. 18, 2019

Related U.S. Application Data

(60) Provisional application No. 62/571,344, filed on Oct. 12, 2017.

(30) Foreign Application Priority Data

May 23, 2018 (CN) .......................... 2018 1 0499468

(51) Int. Cl.
*H01L 33/00* (2010.01)
*H01L 33/50* (2010.01)
(Continued)

(52) U.S. Cl.
CPC .......... *H01L 33/507* (2013.01); *H01L 25/167* (2013.01); *H01L 31/0216* (2013.01);
(Continued)

(58) Field of Classification Search
CPC ............... H01L 25/167; H01L 31/0216; H01L 31/02322; H01L 31/02325; H01L 31/03044; H01L 31/035218; H01L 31/125
(Continued)

(56) References Cited

U.S. PATENT DOCUMENTS 7,839,091 B2   11/2010   Kohashikawa et al.
8,258,693 B2 *  9/2012   Cok ...................... H01L 27/322
                                                              313/503
(Continued)

FOREIGN PATENT DOCUMENTS

CN   101268720 A   9/2008
CN   106684108 A   5/2017

OTHER PUBLICATIONS

Ohinese language office action dated Nov. 29, 2019, issued in application No. CN 201810499468.8.

*Primary Examiner* — Tan N Tran
(74) *Attorney, Agent, or Firm* — McClure, Qualey & Rodack, LLP (57) ABSTRACT

A display device is provided. The display device includes a plurality of pixels. At least one of the pixels includes a semiconductor device having a light-emitting area, a first light conversion layer disposed on the semiconductor device and a first scattering layer disposed on the semiconductor device. The first scattering layer is disposed on the first light conversion layer.

18 Claims, 8 Drawing Sheets

(51) Int. Cl.
H01L 25/16 (2006.01)
H01L 33/48 (2010.01)
H01L 31/16 (2006.01)
H01L 31/0216 (2014.01)
H01L 31/0232 (2014.01)
H01L 31/0352 (2006.01)
H01L 31/12 (2006.01)
H01L 31/0304 (2006.01)
H01L 31/173 (2006.01)
H01L 31/153 (2006.01)
H01L 33/32 (2010.01)
H01L 33/06 (2010.01)

(52) U.S. Cl.
CPC .. *H01L 31/02162* (2013.01); *H01L 31/02322* (2013.01); *H01L 31/02325* (2013.01); *H01L 31/03044* (2013.01); *H01L 31/035218* (2013.01); *H01L 31/125* (2013.01); *H01L 31/153* (2013.01); *H01L 31/16* (2013.01); *H01L 31/173* (2013.01); *H01L 33/483* (2013.01); *H01L 33/06* (2013.01); *H01L 33/32* (2013.01); *H01L 2933/0091* (2013.01)

(58) Field of Classification Search
USPC .................................................. 257/98, 84
See application file for complete search history.

(56) References Cited

U.S. PATENT DOCUMENTS

| 8,912,562 | B2* | 12/2014 | Ouderkirk | H01L 33/60 |
| | | | | 257/98 |
| 9,035,340 | B2* | 5/2015 | Kim | C09K 11/7734 |
| | | | | 257/100 |
| 9,581,759 | B2* | 2/2017 | Kim | G02F 1/133603 |
| 9,666,645 | B2* | 5/2017 | Yata | H01L 27/3218 |
| 2016/0133675 | A1 | 5/2016 | Yata et al. | |

* cited by examiner

DISPLAY DEVICE AND ELECTRONIC DEVICE

CROSS REFERENCE TO RELATED APPLICATIONS

This application claims priority of U.S. Provisional Patent Application No. 62/571,344, filed on Oct. 12, 2017, and Chinese Patent Application No. 201810499468.8, filed on May 23, 2018, the entirety of which is incorporated by reference herein.

BACKGROUND

Technical Field

The present disclosure relates to a display device and an electronic device, and in particular relates to a display device containing a scattering layer.

Description of the Related Art

Electronic products that come with a display panel, such as smartphones, tablets, notebooks, monitors, and TVs, have become indispensable necessities in modern society. With the flourishing development of such portable electronic products, consumers have high expectations regarding the quality, functionality, and price of such products.

Gallium nitride (GaN)-based light-emitting diodes (LEDs) are expected to be used in the high-efficiency lighting devices of the future to replace incandescent and fluorescent lamps. GaN-based LED devices are generally formed on a substrate material by using a heteroepitaxial growth technique. A typical wafer-level LED device structure may include an n-doped GaN layer and a p-doped GaN layer formed on a sapphire substrate, and a single quantum well (SQW) or a multiple quantum well (MQW) disposed between the n-doped GaN layer and the p-doped GaN layer.

Micro LED technology is an emerging flat panel display technology. Micro LED displays drive an array of addressed micro LEDs. In current manufacturing methods, nanometer (nm) or submicron particles having high reflection coefficients are usually added to the light conversion layer to increase the light absorption efficiency or scattering efficiency of quantum dot materials in the light conversion layer. In general, particles having high reflection coefficients are uniformly mixed with the quantum dot materials and then are added to the light conversion layer. However, the addition of high concentration of particles having high reflection coefficients would relatively lower the concentration of the quantum dot materials, which may weaken the structure of the conversion layer. In addition, in a display array including numerous pixels, many variations often exist among the pixels. For example, the light intensity or the wavelength of the emitting light of the LEDs may be different in each pixel.

Accordingly, the development of a structural design that can effectively improve the light extraction efficiency or the consistency of pixels of a display device is one of the goals that the industry currently aims for.

SUMMARY

In accordance with some embodiments of the present disclosure, a display device is provided. The display device includes a plurality of pixels. At least one of the pixels includes a semiconductor device including a light-emitting area, a first light conversion layer disposed on the semiconductor device, and a first scattering layer disposed on the semiconductor device. The first scattering layer is disposed on the first light conversion layer.

In accordance with some embodiments of the present disclosure, an electronic device is provided. The electronic device includes a substrate and a plurality of pixels disposed on the substrate. At least one of the pixels includes a semiconductor device including a light-emitting element, a first light conversion layer disposed on the semiconductor device, and a first scattering layer disposed on the semiconductor device. The first scattering layer is disposed on the first light conversion layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The electronic device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

It should be understood that the descriptions of the exemplary embodiments are intended to be read in connection with the accompanying drawings, which are to be considered part of the entire written description. The drawings are not drawn to scale. In addition, structures and devices are shown schematically in order to simplify the drawing.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In accordance with some embodiments of the present disclosure, an electronic device is provided. The electronic device includes a display device. The display device includes a scattering layer containing the particles having high reflection coefficients. The combination of the scattering layer and the light conversion layer may prevent addition of excessive high reflection coefficient particles in the light conversion layer. Therefore, the risk of structural weakening of the light conversion layer due to the decreased relative concentration of the quantum dot materials may be prevented. The combination of the scattering layer and the light conversion layer may solve the problems caused by the loading effect of the material, and may relatively increase the concentration of the quantum dot materials in the light conversion layer. Accordingly, the overall light extraction efficiency of the display device may be improved.

In accordance with some embodiments of the present disclosure, the display device may include a light-emitting area and a light-sensing area at the same time. The light-sensing element located in the light-sensing area may detect the characteristics (e.g., intensity or wavelength and so on) of the light output from the light-emitting area, and the display device may adjust and control the related signals of the light-emitting element in the light-emitting area accordingly. Therefore, the display device may have a self-monitoring function.

Figure 1A:
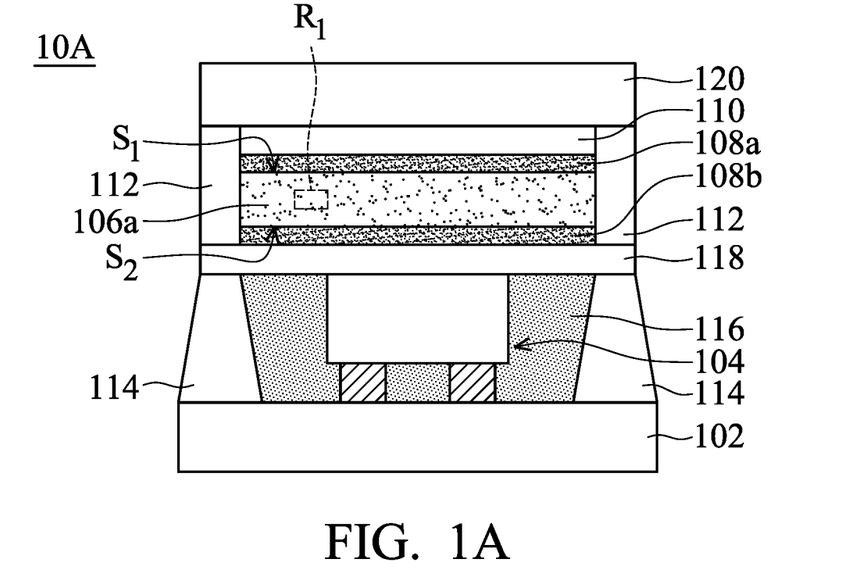
FIGS. 1A-1F illustrate the cross-sectional views of the display devices in accordance with some embodiments of the present disclosure.

FIG. 1A illustrates a cross-sectional view of a display device 10A in accordance with some embodiments of the present disclosure. It should be understood that the display device 10A may include a plurality of pixels while FIG. 1A only illustrates the structure of the display device 10A corresponding to one pixel for clarity. As shown in FIG. 1A, the display device 10A may include a substrate 102, a semiconductor device 104, a first light conversion layer 106a and a first scattering layer 108a. In some embodiments, the substrate 102 may serve as a driving substrate of the display device 10A. Specifically, the substrate 102 may further include a driving circuit (not illustrated), for example, a switch for controlling the semiconductor device 104. The driving circuit may be an active driving circuit or a passive driving circuit. For example, the driving circuit may include a thin-film transistor (TFT) in accordance with some embodiments. In some other embodiments, the driving circuit may be controlled by an exterior integrated circuit (IC) or microchip.

In some embodiments, the substrate 102 may include, but is not limited to, glass, quartz, sapphire, polycarbonate (PC), polyimide (PI), polyethylene terephthalate (PET), rubbers, glass fibers, other suitable materials, or a combination thereof. In some embodiments, the substrate 102 may be made of a metal-glass fiber composite plate, a metal-ceramic composite plate, a printed circuit board and so on.

Figure 2A:
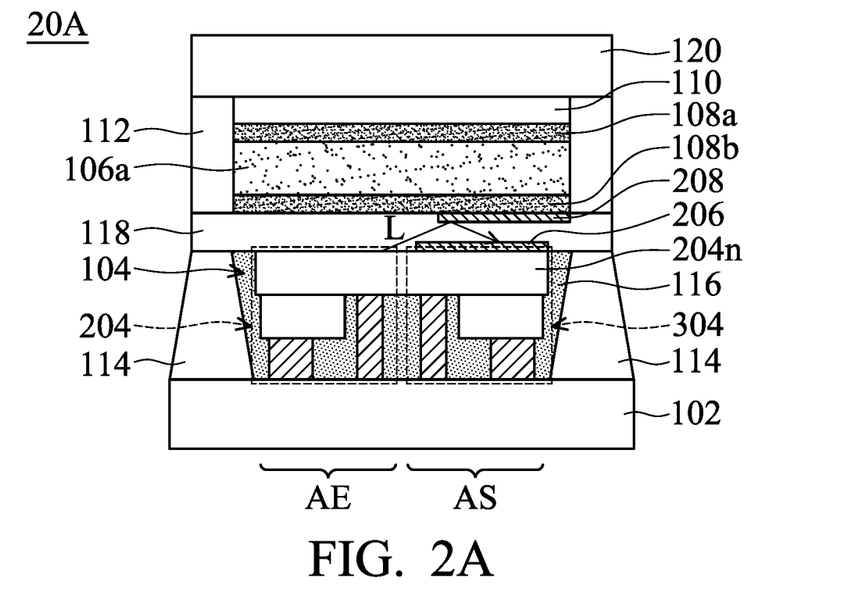
FIGS. 2A-2D illustrate the cross-sectional views of the display devices in accordance with some embodiments of the present disclosure.

As shown in FIG. 1A, the semiconductor device 104 is disposed on the substrate 102. The semiconductor device 104 may include a light-emitting element (e.g., the light-emitting element 204 as shown in FIG. 2A). For example, in some embodiments, the light-emitting element may include a LED a micro LED or an organic light-emitting diode (OLED). In some embodiments, the light-emitting element may have a size (length×width×height) of about 1 μm×1 μm×1 μm to about 150 μm×150 μm×150 μm. In some embodiments, the light-emitting element may provide a light source having a short wavelength. For example, the wavelength of the light source may be in a range from about 360 nm to about 480 nm. In addition, the semiconductor device 104 may be electrically connected to the driving circuit of the substrate 102. It should be understood that although the detailed structure of the semiconductor device 104 is not illustrated in the figure, one with ordinary skill in the art may dispose suitable structures of the semiconductor device 104 according to needs. For example, in the embodiments where the semiconductor device 104 is a LED or a micro LED, the semiconductor device 104 may include a first semiconductor layer having p-type conductivity, a second semiconductor layer having n-type conductivity, a quantum well layer disposed between the first semiconductor layer and the second semiconductor layer and a p-electrode and an n-electrode that are respectively electrically connected to the first semiconductor layer and the second semiconductor layer and so on. The first semiconductor layer may be formed of gallium nitride having p-type conductivity (p-GaN) and the second semiconductor layer may be formed of gallium nitride having n-type conductivity (n-GaN). The quantum layer may include a single quantum well (SQW) or a multiple quantum well (MQW). The material of the quantum well layer may include, but is not limited to, indium gallium nitride, gallium nitride or a combination thereof.

In addition, the first light conversion layer 106a is disposed on the semiconductor device 104. The first light conversion layer 106a has the function of converting the wavelength of light, for example, light generated from the light-emitting unit of the semiconductor device 104 may be converted to light having a particular range of wavelength (having particular colors). In some embodiments, the first light conversion layer 106a may include a matrix and particles dispersed in the matrix. In some embodiments, the material of the matrix may include, but is not limited to, organic polymers, inorganic polymers, glasses or a combination thereof. The matrix may be transparent or semi-transparent in accordance with some embodiments.

Furthermore, in some embodiments, the above particles include, but are not limited to, phosphors, quantum dot materials or a combination thereof. In some embodiments, the first light conversion layer 106a may include phosphors that can convert the light source into red light, green light, blue light or light having any other suitable colors. In some embodiments, the quantum dot material may have a core-shell structure. The core structure may include, but is not limited to, CdSe, CdTe, CdS, ZnS, ZnSe, ZnO, ZnTe, InAs, InP, GaP, any other suitable material or a combination thereof. The shell structure may include, but is not limited to, ZnS, ZnSe, GaN, GaP, any other suitable material or a combination thereof. In addition, the light conversion layer 106a may also include a small amount of scattering particles that have high reflection coefficients. The scattering particles having high reflection coefficients may increase light absorption efficiency or scattering efficiency of the quantum dot materials. The particle size of the scattering particles may be in a range from about 20 nm to about 500 nm in accordance with some embodiments. In some embodiments, the material of the scattering particles includes titanium (Ti). For example, in some embodiments, the scattering particle may include, but is not limited to, titanium dioxide ($TiO_2$), niobium-doped titanium oxide (TNO), zinc oxide (ZnO), zirconium dioxide ($ZrO_2$) or a combination thereof. The scattering particles may be made of any material having a high refractive index and a high reflectance. However, it should be noted that the concentration of the scattering particles contained in the first light conversion layer 106a is less than the concentration of the scattering particles contained in the first scattering layer 108a. The concentrations used in the present disclosure may refer to weight percentage concentrations or other concentration units that are commonly used in the art. Furthermore, in some embodiments, the first light conversion layer 106a may be formed by a coating process, a printing process, another suitable process, or a combination thereof.

Still referring to FIG. 1A, the first scattering layer 108a is disposed on the semiconductor device 104 and is also disposed on the first light conversion layer 106a. The first scattering layer 108a includes the scattering particles having high reflection coefficients and may increase light scattering and absorption. In some embodiments, the reflectance of the scattering particles having high reflection coefficients may be in a range from about 50% to about 100%. In some embodiments, the scattering particles having high reflection coefficients may have a particle size ranging from about 20 nm to about 500 nm. In some embodiments, the refractive index of the scattering particles having high reflection coefficients may be in a range from about 1.5 to about 3.

Specifically, the first scattering layer 108a may include a matrix and the scattering particles dispersed in the matrix. In some embodiments, the material of the matrix may include, but is not limited to, organic polymers, inorganic polymers, glasses or a combination thereof. The matrix may be transparent or semi-transparent in accordance with some embodiments. In some embodiments, the material of the scattering particles includes titanium (Ti). In some embodiments, the scattering particle may include, but is not limited to, titanium dioxide ($TiO_2$), niobium-doped titanium oxide (TNO), zinc oxide (ZnO), zirconium dioxide ($ZrO_2$) or a combination thereof. The scattering particles may be made of any material having a high refractive index and a high reflectance. It should be noted that the concentration of the scattering particles contained in the first scattering layer 108a is greater than the concentration of the scattering particles contained in the first light conversion layer 106a.

In some embodiments, the first scattering layer 108a may be formed by a chemical vapor deposition process (CVD), a coating process, a lithography process, a screen printing process, an ink jet printing (IJP) process, another suitable process, or a combination thereof.

In addition, the concentration of the scattering particles contained in the first scattering layer 108a is greater than the concentration of the scattering particles contained in the first light conversion layer 106a in accordance with some embodiments. Therefore, the scattering particles may be diffused from the first scattering layer 108a to the first light conversion layer 106a. In other words, the concentration of scattering particles at an interface S1 of the first scattering layer 108a and the first light conversion layer 106a may be greater than the concentration of scattering particles in the area of the first light conversion layer 106a that is located out of the interface S1 (non-interfacial area). More specifically, since the scattering particles include titanium, the interface S1 of the first scattering layer 108a and the first light conversion layer 106a has a first titanium concentration, and a first area R1 of the first light conversion layer 106a that is located out of the interface S1 has a second titanium concentration. The first titanium concentration is greater than the second titanium concentration in accordance some embodiments. The concentration referred to herein is calculated by the weight percentage concentration.

In particular, the scattering particles having high reflection coefficients are mainly disposed in the first scattering layer 108a, and therefore the presence of excessive scattering particles in the first light conversion layer 106a may be prevented and decrease of the relative concentration of the light conversion materials may be avoided. In other words, the combination of the first light conversion layer 106a and the first scattering layer 108a may solve the problem caused by the loading effect of materials, for example, the structural weakening of the first light conversion layer 106a may be improved.

Still referring to FIG. 1A, the display device 10A may further include a second scattering layer 108b in accordance with some embodiments. The second scattering layer 108b may be disposed below the first light conversion layer 106a. That is, the first light conversion layer 106a may be disposed between the first scattering layer 108a and the second scattering layer 108b. The second scattering layer 108b may also include the scattering particles having high reflection coefficients, which may increase the scattering of light.

Specifically, the second scattering layer 108b may include a matrix and the scattering particles dispersed in the matrix. In some embodiments, the material of the matrix may include, but is not limited to, organic polymers, inorganic polymers, glasses or a combination thereof. The matrix may be transparent or semi-transparent in accordance with some embodiments. In some embodiments, the material of the scattering particles includes titanium (Ti). For example, in some embodiments, the scattering particle may include, but is not limited to, titanium dioxide ($TiO_2$), niobium-doped titanium oxide (TNO), zinc oxide (ZnO), zirconium dioxide ($ZrO_2$) or a combination thereof. The scattering particles may be made of any material having a high refractive index and a high reflectance. In some embodiments, the second scattering layer 108b may be formed by a chemical vapor deposition process (CVD), a coating process, a lithography process, a screen printing process, an ink jet printing (IJP) process, another suitable process, or a combination thereof.

It should be noted that the concentration of the scattering particles contained in the second scattering layer 108b is greater than the concentration of the scattering particles contained in the first light conversion layer 106a. In addition, in some embodiments, the concentration of the scattering particles contained in the second scattering layer 108b is less than the concentration of the scattering particles contained in the first scattering layer 108a. More specifically, since the scattering particles include titanium, the first scattering layer 108a has a third titanium concentration and the second scattering layer 108b has a fourth titanium concentration. The third titanium concentration is greater than the fourth titanium concentration in accordance with some embodiments. The third titanium concentration and the fourth titanium concentration may be referred to the average concentrations of the first scattering layer 108a and the second scattering layer 108b, respectively.

The concentration of the scattering particles contained in the second scattering layer 108b is greater than the concentration of the scattering particles contained in the first light conversion layer 106a in accordance with some embodiments. Therefore, the scattering particles may diffuse from the second scattering layer 108b to the first light conversion layer 106a. In other words, the concentration of scattering particles at an interface S2 of the second scattering layer 108b and the first light conversion layer 106a may be greater than the concentration of scattering particles in the area of the first light conversion layer 106a that is located out of the interface S2 (non-interfacial area). More specifically, since the scattering particles include titanium, the interface S2 of the second scattering layer 108b and the first light conversion layer 106a has a fifth titanium concentration, and the first area R1 of the first light conversion layer 106a that is located out of the interface S2 has the second titanium concentration. The fifth titanium concentration is greater than the second titanium concentration in accordance with some embodiments.

Furthermore, the display device 10A may further include a color filter layer 110 disposed on the first scattering layer 108a in accordance with some embodiments. The color filter layer 110 may further filter or adjust the optical properties of the light that penetrates through the first light conversion layer 106a and the first scattering layer 108a. In some embodiments, the color filter layer 110 may include a red filter, a green filter, a blue filter, the filters having other suitable colors or properties or combinations thereof.

The display device 10A may further include a first light-shielding layer 112 in accordance with some embodiments. The first light-shielding layers 112 are disposed adjacent to the first light conversion layer 106a, the first scattering layer 108a, the second scattering layer 108b and the color filter layer 110. In some embodiments, the first light conversion layer 106a, the first scattering layer 108a, the second scattering layer 108b and the color filter layer 110 are sandwiched between the first light shielding layers 112. In addition, in some embodiments, the display device 10A may further include a second light-shielding layer 114, and the second light-shielding layer 114 may be disposed on the substrate 102 and disposed adjacent to the semiconductor device 104. The substrate 102 and the second-light shielding layers 114 may together define the space for accommodating the semiconductor device 104. In addition, the first light-shielding layer 112 and the second light-shielding layer 114 may be used to prevent the cross-talk of the display device and increase the range of color gamut. The first light-shielding layer 112 and the second light-shielding layer 114 may substantially define the pixel area of the display device in accordance with some embodiments. In some embodiments, each pixel may correspond to one semiconductor device 104. However, in some other embodiments, each pixel may correspond to more than one semiconductor devices 104. As shown in FIG. 1A, from the cross-sectional perspective, the second light-shielding layers 114 are disposed at both sides of the semiconductor device 104.

The first light-shielding layer 112 and the second light-shielding layer 114 may be formed of the materials having light-shielding feature. In some embodiments, the first light-shielding layer 112 and the second light-shielding layer 114 may be formed of opaque materials. In some embodiments, the first light-shielding layer 112 and the second light-shielding layer 114 may include, but are not limited to, organic resins, glass pastes, other suitable materials or a combination thereof. In some embodiments, the first light-shielding layer 112 and the second light-shielding layer 114 may further include metallic particles (such as nickel, aluminum, molybdenum, and alloys thereof), metal oxide particles (such as chromium oxide, titanium oxide), or metal nitride particles (e.g. chromium nitride) or a combination thereof. The first light-shielding layer 112 and the second light-shielding layer 114 may be formed of the same material in accordance with some embodiments. The first light-shielding layer 112 and the second light-shielding layer 114 may be formed of different materials in accordance with some embodiments.

In some embodiments, the first light-shielding layer 112 and the second light-shielding layer 114 may be formed by a chemical vapor deposition process (CVD), a coating process, a printing process, another suitable process, or a combination thereof. In addition, it should be understood that the shapes of the first light-shielding layer 112 and the second light-shielding layer 114 are not limited to the shapes shown in FIG. 1A. In some embodiments, the first light-shielding layer 112 and the second light-shielding layer 114 may be adjusted to have any other suitable shape as needed.

Furthermore, the display device 10A may further include a first protection layer 116 in accordance with some embodiments. In some embodiments, the second light-shielding layers 114 are disposed on both sides of the first protection layer 116. Specifically, the first protection layer 116 may be filled in the space defined by the second light-shielding layers 114 and the substrate 102, and may surround the semiconductor device 104. The first protection layer 116 may be used to prevent moisture or oxygen from damaging the semiconductor device 104. In some embodiments, the top surface of the first protection layer 116 may be substantially aligned with the top surface of the semiconductor device 104.

The first protection layer 116 may be transparent or semi-transparent in accordance with some embodiments. The first protection layer 116 may be formed of organic materials or inorganic materials. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS), other suitable materials, or a combination thereof. In some embodiments, the inorganic material may include, but is not limited to, silicon nitride, silicon oxide, silicon oxynitride, aluminum oxide, titanium dioxide, other suitable materials, or a combination thereof. In some embodiments, the first protection layer 116 may be formed by a chemical vapor deposition process (CVD), a coating process, a printing process, another suitable process, or a combination thereof.

Still referring to FIG. 1A, the display device 10A may further include an adhesive layer 118 disposed between the semiconductor device 104 and the first light conversion layer 106a in accordance with some embodiments. In some embodiments, the adhesive layer 118 is disposed between the first light-shielding layer 112 and the second light-shielding layer 114 to fix the overall structure of the display device 10A. As shown in FIG. 1A, the adhesive layer 118 may be in contact with the second scattering layer 108b and the semiconductor device 104 in accordance with some embodiments.

In some embodiments, the adhesive layer 118 may be transparent or semi-transparent. The adhesive layer 118 may be formed of the adhesive materials. In some embodiments, the adhesive layer 118 may include, but is not limited to, optical clear adhesive (OCA), optical clear resin (OCR), other suitable adhesive materials or a combination thereof.

In addition, the display device 10A may further include a second protection layer 120 disposed on the first scattering layer 108a in accordance with some embodiments. In some embodiments, the color filter layer 110 is disposed between the second protection layer 120 and the first scattering layer 108a. In some embodiments, the second protection layer 120 may be a cover substrate. The material of the cover substrate may include, but is not limited to, glass, quartz, sapphire, polycarbonate (PC), polyimide (PI), polyethylene terephthalate (PET), rubbers, glass fibers, other suitable materials, or a combination thereof. In some other embodiments, the second protection layer 120 may be a coating layer. In some embodiments, the coating layer may be formed of organic materials or inorganic materials. In some embodiments, the organic material may include, but is not limited to, epoxy resins, acrylic resins such as polymethylmetacrylate (PMMA), benzocyclobutene (BCB), polyimide, and polyester, polydimethylsiloxane (PDMS), other suitable materials, or a combination thereof. In some embodiments, the inorganic material may include, but is not limited to, silicon nitride, silicon oxide, silicon oxynitride, aluminum oxide, titanium dioxide, other suitable materials, or a combination thereof.

Figure 1B:
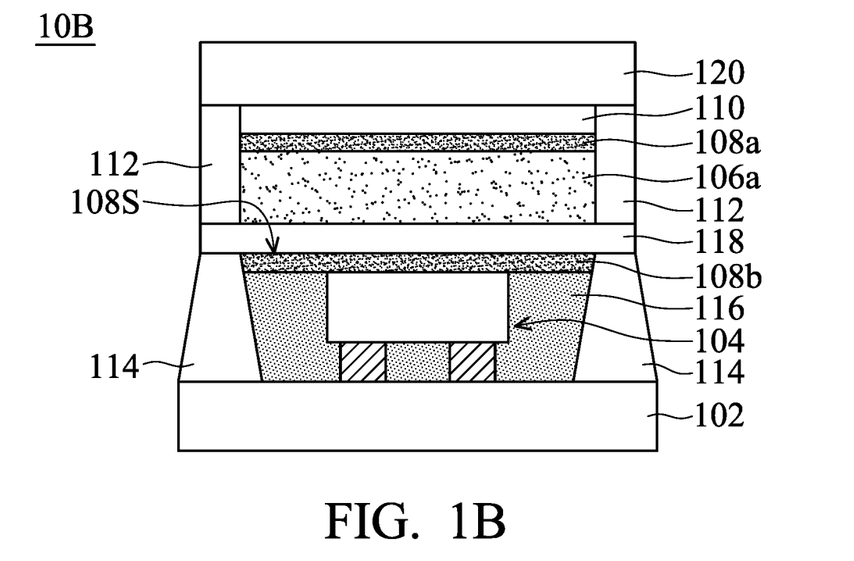

Next, referring to FIG. 1B, FIG. 1B illustrates a cross-sectional view of a display device 10B in accordance with some other embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein. The display device 10B shown in FIG. 1B is similar to the display device 10A shown in FIG. 1A. The difference between them is that the second scattering layer 108b is disposed below the adhesive layer 118 in the display device 10B. The second scattering layer 108b is disposed between the adhesive layer 118 and the semiconductor device 104. In this embodiment, the second scattering layer 108b covers the semiconductor device 104 and is in contact with the semiconductor device 104. In addition, the second scattering layer 108b may also serve as a filling material to fill up the first protective layer 116. In some embodiments, the top surface 108S of the second scattering layer 108b may be substantially aligned with the second light-shielding layer 114. In particular, when the second scattering layer 108b is in direct contact with the semiconductor device 104, the emission uniformity of the light-emitting element of the semiconductor device 104 may be further improved, and thereby the light extraction efficiency may be improved.

Figure 1C:
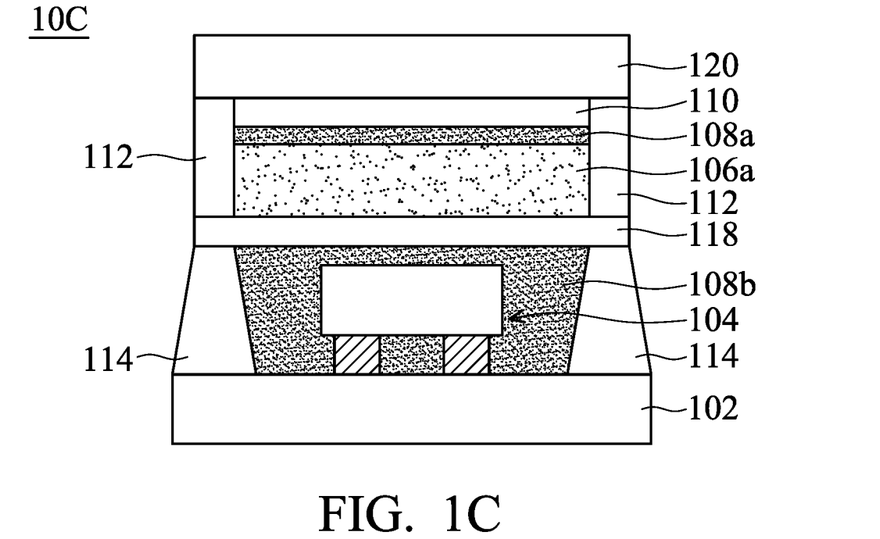

Next, referring to FIG. 1C, FIG. 1C illustrates a cross-sectional view of a display device 10C in accordance with some other embodiments of the present disclosure. The display device 10C shown in FIG. 1C is similar to the display device 10A shown in FIG. 1A. The difference between them is that the second scattering layer 108b is filled in the space defined by the adhesive layer 118, the second light-shielding layer 114, and the substrate 102, and the second scattering layer 108b surrounds the semiconductor device 104. In this embodiment, the first protection layer 116 may be omitted from the display device 10C. In addition, in this embodiment, the second scattering layer 108b may also be in contact with the semiconductor device 104.

Figure 1D:
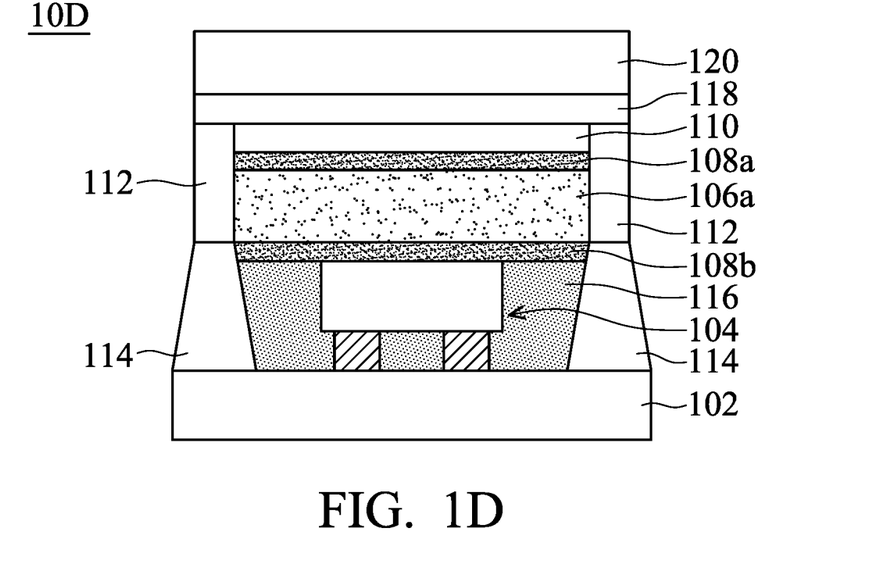

Next, referring to FIG. 1D, FIG. 1D illustrates a cross-sectional view of a display device 10D in accordance with some other embodiments of the present disclosure. The difference between the display device 10D shown in FIG. 1D and the display device 10A shown in FIG. 1A is that the adhesive layer 118 is disposed between the color filter layer 110 and the second protection layer 120 in the display device 10D. The adhesive layer 118 may be used to fix the second protection layer 120 on the color filter layer 110 and the first light-shielding layer 112. In this embodiment, the adhesive layer 118 is absent between the second scattering layer 108b and the semiconductor device 104. In other words, the second scattering layer 108b directly covers the semiconductor device 104 and is in contact with the semiconductor device 104. In addition, in this embodiment, the first light conversion layer 106a is sandwiched between the first scattering layer 108a and the second scattering layer 108b.

Figure 1E:
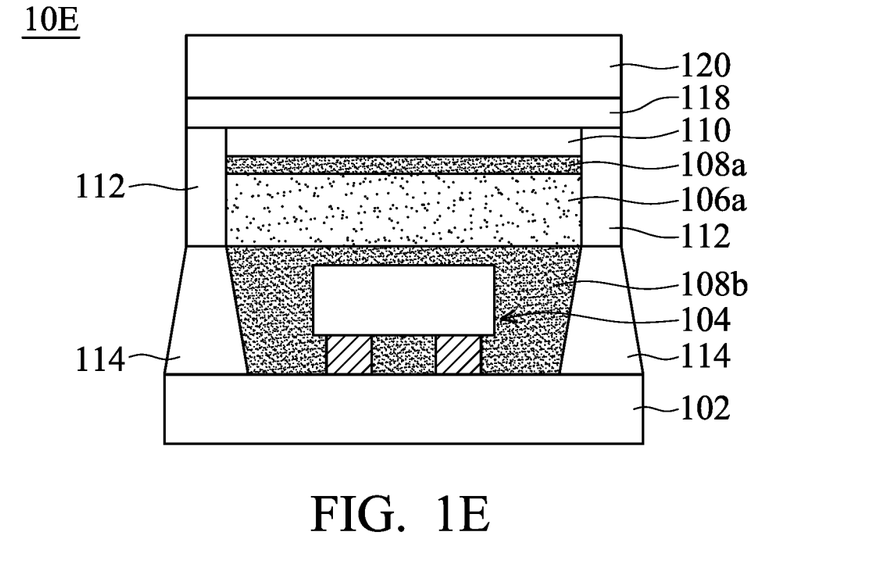

Next, referring to FIG. 1E, FIG. 1E illustrates a cross-sectional view of a display device 10E in accordance with some other embodiments of the present disclosure. The display device 10E shown in FIG. 1E and the display device 10D shown in FIG. 1D are similar. The difference between them is that the second scattering layer 108b is further filled in the space defined by the second light-shielding layer 114 and the substrate 102 in the display device 10E, and the second scattering layer 108b surrounds the semiconductor device 104. In this embodiment, the first protection layer 116 may be omitted from the display device 10E. In addition, in this embodiment, the second scattering layer 108b may be in contact with the semiconductor device 104 and the first light conversion layer 106a at the same time.

Figure 1F:
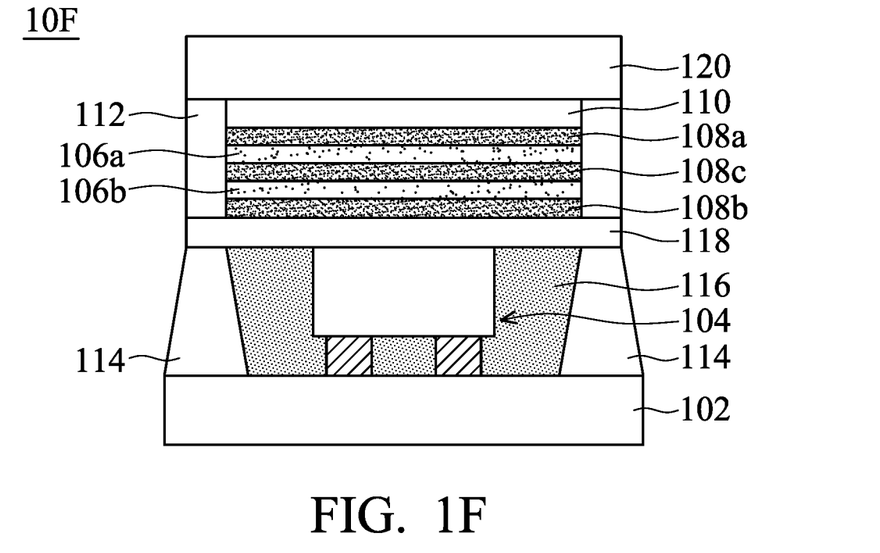

Next, referring to FIG. 1F, FIG. 1F illustrates a cross-sectional view of a display device 10F in accordance with some other embodiments of the present disclosure. The difference between the display device 10F shown in FIG. 1F and the display device 10A shown in FIG. 1A is that the display device 10F includes two light conversion layers. Specifically, the display device 10F further includes a third light conversion layer 106b, and a third scattering layer 108c disposed between the first light conversion layer 106a and the third light conversion layer 106b. In some embodiments, the display device may include more than two layers of light conversion layers. In some embodiments, the display device may include the stacking structure including multiple light conversion layers and multiple scattering layers. For example, the stacking structure may include n light conversion layers and n+1 scattering layers.

Next, referring to FIG. 2A, FIG. 2A illustrates a cross-sectional view of a display device 20A in accordance with some embodiments of the present disclosure. As shown in FIG. 2A, the semiconductor device 104 of the display device 20A may include a light-emitting area AE and a light-sensing area AS in accordance with some embodiments. In addition, the semiconductor device 104 may include a light-emitting element 204 and a sensing element 304 disposed corresponding to the light-emitting area AE and the light-sensing area AS. In some embodiments, the light-emitting element 204 may be an LED or a micro LED. In some embodiments, the sensing element 304 may be a photo-coupling element for converting the sensed light into electronic signals.

Moreover, the display device 20A further includes a second light conversion layer 206. The second light conversion layer 206 is disposed in the light-sensing area AS, and the second light conversion layer 206 is disposed between the sensing element 304 and the first light conversion layer 106a. In some embodiments, the second light conversion layer 206 is disposed between the sensing element 304 and the second scattering layer 108b, and is in contact with the sensing element 304 and the adhesive layer 118. In some embodiments, the second light conversion layer 206 may absorb the light L emitted from the light-emitting area AE and convert it. In some embodiments, the second light conversion layer 206 may convert the main peak wavelength of the light L. For example, in some embodiments, the second light conversion layer 206 converts the first light to a second light (not illustrated). In some embodiments, the second light conversion layer 206 may convert the light having great main peak wavelength (the first light) to the light having small main peak wavelength (the second light). For example, the second light conversion layer 206 may convert visible light (the first light) into UV light (the second light), and then the converted light may be absorbed by the sensing element 304. In other words, in some embodiments, the main peak wavelength of the light L that has been converted by the second light conversion layer 206 may be smaller than the main peak wavelength of the light L emitted from the light-emitting region AE. That is, the main peak wavelength of the light L that is sensed by the light-sensing area AS is smaller than the main peak wavelength of the light L that is emitted from the light-emitting area AE.

The second light conversion layer 206 may be formed of materials having the characteristic of converting the main peak wavelength of the light. In some embodiments, the second light conversion layer 206 may include, but is not limited to, $Y_2SiO_5:Pr_3+$. In some embodiments, the second light conversion layer 206 may be formed by a chemical vapor deposition process (CVD), an epitaxial growth technique, another suitable process, or a combination thereof.

Furthermore, in some embodiments, the sensing element 304 may be additionally electrically connected to a sensing circuit (not illustrated). The sensing circuit may transmit the electronic signal received from the sensing element 304 to a signal processor (not illustrated). The signal processor may give the corresponding signal to the light-emitting element 204 according to the received signal, and may adjust the light-emitting element 204 accordingly, for example, may adjust the light-emitting intensity and so on. With such a configuration, a compensation mechanism between the sensing element 304 and the light-emitting element 204 may be accomplished. Therefore, the display device may have a self-monitoring function, and the display quality and consistency of pixels may be improved.

In addition, the display device 20A may further include a reflective layer 208 in accordance with some embodiments. The reflective layer 208 may be disposed between the second scattering layer 108b and the semiconductor device 104. In some other embodiments, the reflective layer 208 may be disposed at any layer between the semiconductor device 104 and the second protective layer 120. The reflective layer 208 may be used to assist in reflecting the light L emitted by the light-emitting element 204 to the second light conversion layer 206 in the light-sensing area AS. In some embodiments, the display device 20A may not have the reflective layer 208 while the first light conversion layer 106a or the color filter layer 110 that possess reflective characteristics may reflect the light directly.

The reflective layer 208 may be formed of materials having reflective properties. In some embodiments, the material of the reflective layer 208 may include metal. For example, the material of the reflective layer 208 may include, but is not limited to, Cu, Al, In, Ru, Sn, Au, Pt, Zn, Ag, Ti, Pb, Ni, Cr, Mg, Pd, other suitable materials, or a combination thereof. In some embodiments, the reflective layer 208 may be formed by a chemical vapor deposition process (CVD), a sputtering process, a resistance heating evaporation process, an electron beam evaporation process, a printing process, or another suitable process.

In addition, as shown in FIG. 2A, the light-emitting element 204 and the sensing element 304 may structurally share a semiconductor layer 204n in accordance with some embodiments. For example, in some embodiments, the light-emitting element 204 and the sensing element 304 share a semiconductor layer having an n-type conductivity. Specifically, in addition to the common n-type semiconductor layer, the light-emitting element 204 and the sensing element 304 may each have a semiconductor layer having a p-type conductivity, the quantum well layer, and the p-electrode and n-electrode that are respectively electrically connected to the p-type semiconductor layer and the n-type semiconductor layer and so on. The n-type semiconductor layer may be formed of gallium nitride having n-type conductivity (n-GaN) and the p-type semiconductor layer may be formed of gallium nitride having p-type conductivity (p-GaN). The quantum layer may include a single quantum well (SQW) or a multiple quantum well (MQW). The material of the quantum well layer may include, but is not limited to, indium gallium nitride, gallium nitride or a combination thereof. In addition, the quantum well layer of the light-emitting element 204 may include the quantum dot materials that may emit blue light or emit other lights having short wavelengths. In some embodiments, the quantum well layer of sensing element 304 may include the quantum dot materials that may absorb UV light.

Figure 2B:
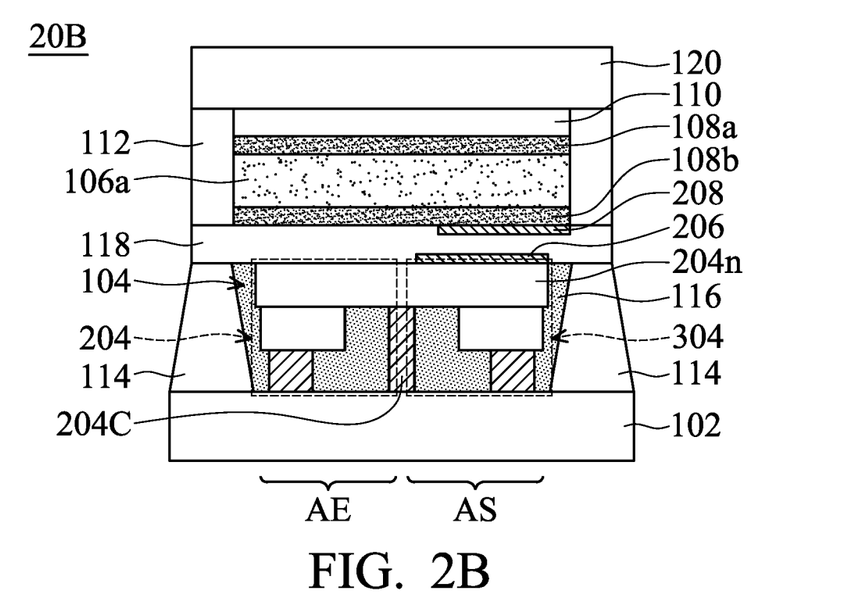

Next, referring to FIG. 2B, FIG. 2B illustrates a cross-sectional view of a display device 20B in accordance with some embodiments of the present disclosure. As shown in FIG. 2B, besides sharing the semiconductor layer 204n, the light-emitting element 204 and the sensing element 304 of the semiconductor device 104 may also structurally share the n-electrode 204C. Therefore, the manufacturing cost may be further reduced.

Figure 2C:
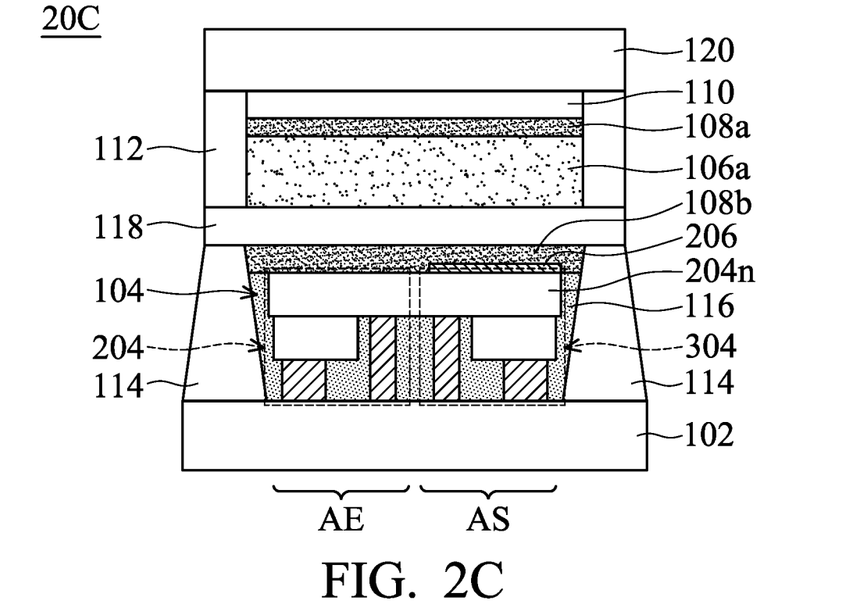

Next, referring to FIG. 2C, FIG. 2C illustrates a cross-sectional view of a display device 20C in accordance with some other embodiments of the present disclosure. The display device 20C shown in FIG. 2C is similar to the display device 20A shown in FIG. 2A. The difference between them is that in the display device 20C, the second light conversion layer 206 is disposed between the adhesive layer 118 and the sensing element 304, and is in contact with the second scattering layer 108b and the sensing element 304. In addition, the reflective layer 208 is absent in this embodiment, but the light emitted from the light-emitting element 204 may be reflected to the second light conversion layer 206 by the first scattering layer 108a, the second scattering layer 108b, the first light conversion layer 106a or the color filter layer 110 and so on, which have reflective properties.

Figure 2D:
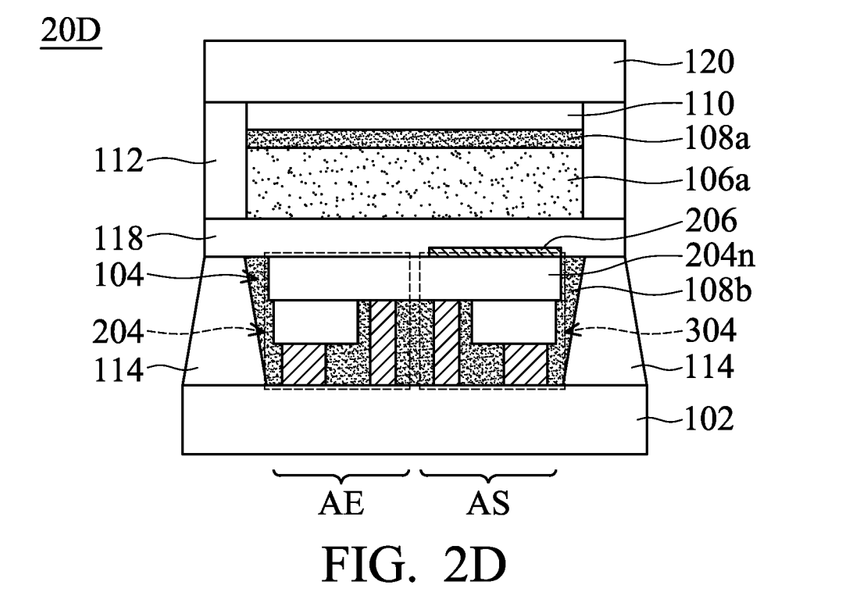

Next, referring to FIG. 2D, FIG. 2D illustrates a cross-sectional view of a display device 20D in accordance with some other embodiments of the present disclosure. The display device 20D shown in FIG. 2D is similar to the display device 20A shown in FIG. 2A. The difference between them is that in the display device 20D, the second scattering layer 108b is filled in the space defined by the second light-shielding layer 114, the substrate 102 and the adhesive layer 118 instead of the first protection layer 116. In addition, the second scattering layer 108b surrounds the light-emitting element 204 and the sensing element 304. In this embodiment, the second light conversion layer 206 is disposed between the sensing element 304 and the adhesive layer 118, and is in contact with the sensing element 304 and the adhesive layer 118.

Figure 3:
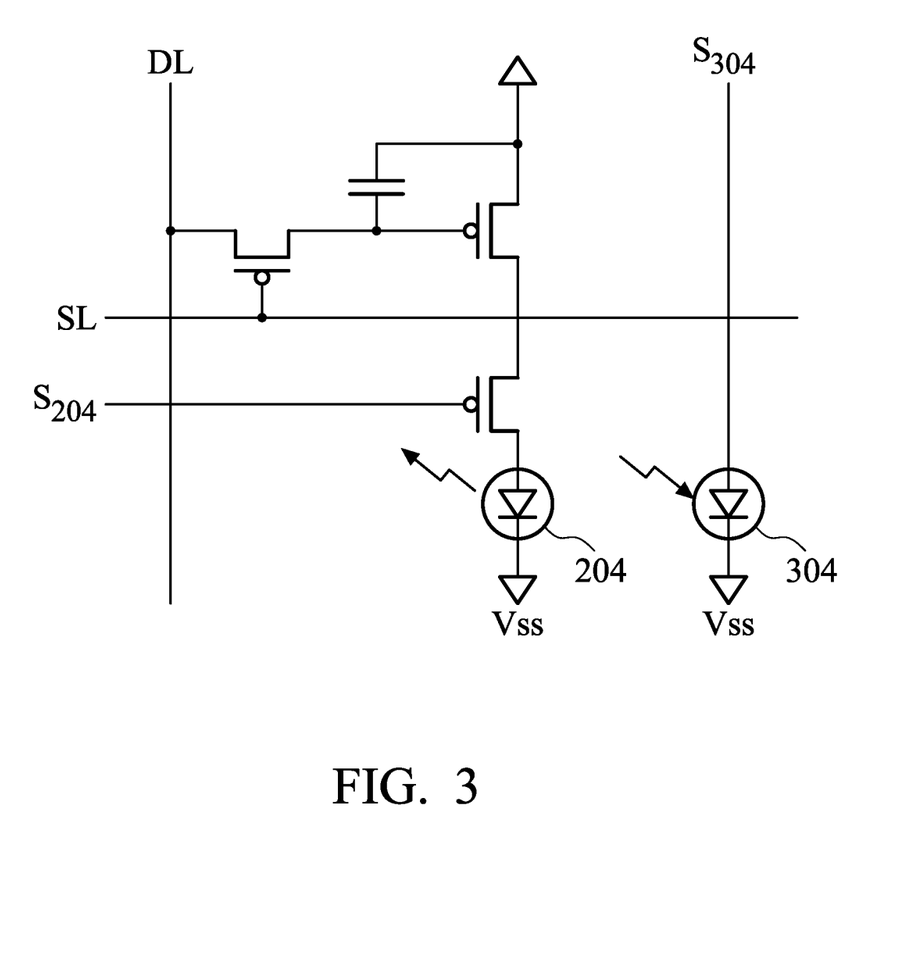
FIG. 3 illustrates a circuit diagram of the semiconductor device of the display device in accordance with some embodiments of the present disclosure.

Next, referring to FIG. 3, FIG. 3 illustrates a circuit diagram of the semiconductor device 104 of the display device in accordance with some embodiments of the present disclosure. As shown in FIG. 3, the semiconductor device 104 may be electrically connected to the scan line (gate line) SL and the data line DL to control the switching of the semiconductor device 104. In addition, the light-emitting element 204 and the sensing element 304 of the semiconductor device 104 may be respectively connected to the signal line S204 and the signal line S304, which control the light-emitting element 204 and the sensing element 304. The signal line S204 and the signal line S304 are connected to the data line DL and the scan line SL respectively. The equivalent circuit that is constructed is shown in FIG. 3.

Figure 4A:
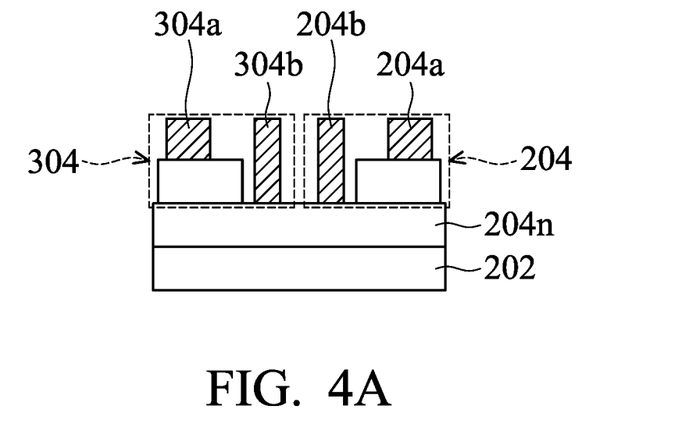
FIGS. 4A-4C are diagrams of the manufacturing process of the display device in accordance with some embodiments of the present disclosure.
Figure 4B:
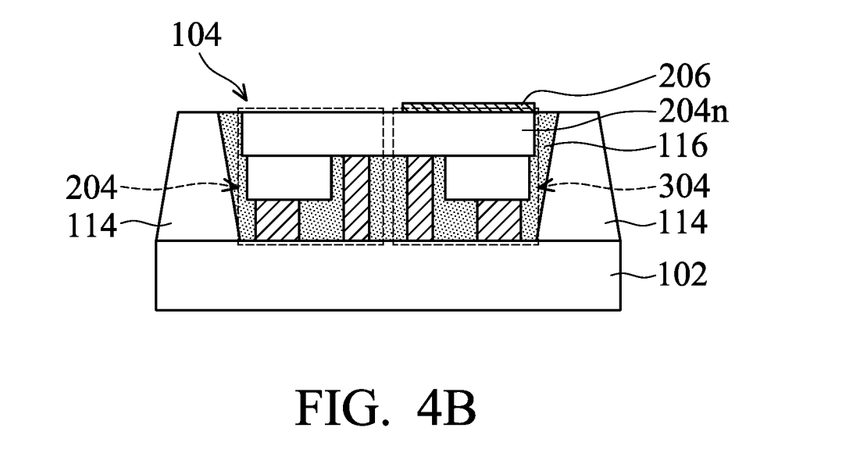
Figure 4C:
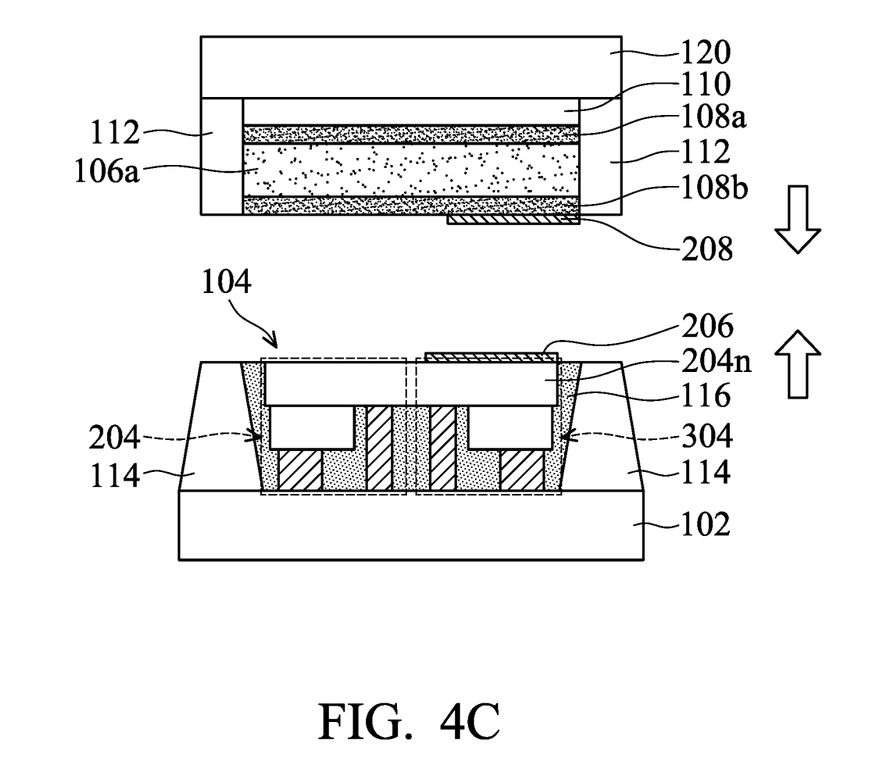

Next, referring to FIGS. 4A-4C, FIGS. 4A-4C illustrate the manufacturing process of the display device 20A in accordance with some embodiments of the present disclosure. First, referring to FIG. 4A, in some embodiments, the light-emitting element 204 and the sensing element 304 may be formed on the carrier substrate 202. Specifically, the common semiconductor layer 204n of the light-emitting element 204 and the sensing element 304 may be formed on the carrier substrate 202 first, and then the other structures of the light-emitting element 204 and sensing element 304 may be separately formed on the semiconductor layer 204n. For example, the semiconductor layers having the opposite conductivity type to the semiconductor layer 204n, the quantum well layers, and the n-electrodes and p-electrodes may be separately formed on the semiconductor layer 204n to form the light-emitting element 204 and the sensing element 304. In some embodiments, the common semiconductor layer 204n of the light-emitting element 204 and the sensing element 304 may be the semiconductor layer having n-type conductivity, e.g., gallium nitride having n-type conductivity (n-GaN). In addition, the light-emitting element 204 and the sensing element 304 may include an electrode 204b and an electrode 304b that are electrically connected to the semiconductor layer 204n respectively. The light-emitting element 204 and the sensing element 304 may also include and an electrode 204a and an electrode 304a that are electrically connected to the semiconductor layer having the opposite conductivity type to the semiconductor layer 204n respectively.

Furthermore, the carrier substrate 202 may temporarily serve as a supporting structure and may be removed in the subsequent process. In some embodiments, the carrier substrate 202 may be a silicon substrate, a glass substrate, a polymer substrate, a polymer-based composite substrate, a sapphire substrate, or a combination thereof, but is not limited thereto.

Next, referring to FIG. 4B, the carrier substrate 202 is removed, and the above semiconductor device 104 is formed on the substrate 102. In some embodiments, the light-emitting element 204 and the sensing element 304 may be formed on the substrate 102 by a surface-mount technology (SMT). In some embodiments, the substrate 102 may be a substrate on which a transistor element has been disposed, such as a TFT substrate.

Next, the second light-shielding layer 114 may be formed on the substrate 102, and the first protection layer 116 may be filled in the space defined by the substrate 102 and the second light-shielding layers 114. In addition, in some embodiments, a planarization process may be performed on the first protection layer 116 after the first protection layer 116 is filled, so that the top surface of the semiconductor device may be substantially aligned with the top surface of the first protection layer 116. Next, the second light conversion layer 206 may be formed on the top surface of the semiconductor device 104.

Next, referring to FIG. 4C, in some embodiments, the color filter layer 110, the first scattering layer 108a, the first light conversion layer 106a, the second scattering layer 108b, the first light-shielding layer 112, the reflective layer 208 and so on may be formed in advance on the second protection layer 120. Then, the structures formed on the second protection layer 120 may be paired with the structures formed on the substrate 102, and may be fixed by the adhesion layer 118 to form the display device 20A.

To summarize the above, the display device provided in the present disclosure includes the scattering layer containing the particles having high reflection coefficients. The combination of the scattering layer and the light conversion layer may prevent addition of excessive high reflection coefficient particles in the light conversion layer. Therefore, the risk of structural weakening of the light conversion layer or decreasing of the light extraction efficiency due to the decreased relative concentration of the quantum dot materials may be prevented. The combination of the scattering layer and the light conversion layer may solve the problems caused by the loading effect of the material, and may increase the relative concentration of the quantum dot materials in the light conversion layer. Accordingly, the overall light extraction efficiency of the display device may be improved.

In addition, in some embodiments, the display device provided in the present disclosure may include a light-emitting area and a light-sensing area at the same time. The light-sensing element located in the light-sensing area may detect the characteristics (e.g., intensity or wavelength and so on) of the light output from the light-emitting area, and the display device may adjust and control the related signals of the light-emitting element in the light-emitting area accordingly. Therefore, the display device may have a self-monitoring function and the consistency of pixels may be improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
a plurality of pixels, and at least one of the plurality of pixels comprising:
a semiconductor device comprising a light-emitting area;
a first light conversion layer disposed on the semiconductor device; and
a first scattering layer comprising titanium (Ti) disposed on the semiconductor device,
wherein the first scattering layer is disposed on the first light conversion layer,
wherein an interface of the first scattering layer and the first light conversion layer has a first titanium concentration, and a first area of the first light conversion layer that is located out of the interface has a second titanium concentration, wherein the first titanium concentration is greater than the second titanium concentration.

2. The display device as claimed in claim 1, wherein the at least one of the plurality of pixels further comprises a second scattering layer disposed below the first light conversion layer.

3. The display device as claimed in claim 2, wherein the second scattering layer surrounds the semiconductor device.

4. The display device as claimed in claim 1, wherein the at least one of the plurality of pixels further comprises a color filter layer disposed on the first scattering layer.

5. The display device as claimed in claim 1, wherein the semiconductor device further comprises a light-sensing area disposed adjacent to the light-emitting area, wherein the light-sensing area senses a first light emitting from the light-emitting area.

6. The display device as claimed in claim 5, wherein the semiconductor device further comprises a second light conversion layer disposed in the light-sensing area, wherein the second light conversion layer converts the first light to a second light.

7. The display device as claimed in claim 6, wherein a main peak wavelength of the second light is smaller than a main peak wavelength of the first light.

8. The display device as claimed in claim 6, further comprising a substrate, and wherein the semiconductor device is disposed on the substrate, and wherein the second light conversion layer is disposed between the substrate and the first light conversion layer.

9. An electronic device, comprising:
a substrate; and
a plurality of pixels disposed on the substrate, and at least one of the plurality of pixels comprising:
a semiconductor device comprising a light-emitting element;
a first light conversion layer disposed on the semiconductor device; and
a first scattering layer comprising titanium (Ti) disposed on the semiconductor device,
wherein the first scattering layer is disposed on the first light conversion layer,
wherein an interface of the first scattering layer and the first light conversion layer has a first titanium concentration, and a first area of the first light conversion layer that is located out of the interface has a second titanium concentration, wherein the first titanium concentration is greater than the second titanium concentration.

10. The electronic device as claimed in claim 9, wherein the at least one of the plurality of pixels further comprises a second scattering layer disposed between the first light conversion layer and the substrate.

11. The electronic device as claimed in claim 10, wherein the second scattering layer surrounds the light-emitting element.

12. The electronic device as claimed in claim 10, wherein the second scattering layer is in contact with the light-emitting element.

13. The electronic device as claimed in claim 10, wherein the second scattering layer surrounds the light-emitting element and is in contact with the light-emitting element.

14. The electronic device as claimed in claim 10, wherein the at least one of the plurality of pixels further comprises a third scattering layer disposed between the first light conversion layer and the second scattering layer.

15. The electronic device as claimed in claim 14, wherein the at least one of the plurality of pixels further comprises a third light conversion layer disposed between the third scattering layer and the second scattering layer.

16. The electronic device as claimed in claim 10, wherein the first scattering layer has a third titanium concentration, and the second scattering layer has a fourth titanium concentration, wherein the third titanium concentration is greater than the fourth titanium concentration.

17. The electronic device as claimed in claim 9, wherein the first scattering layer comprises titanium.

18. The electronic device as claimed in claim 9, wherein the at least one of the plurality of pixels further comprises:
a protection layer disposed on the first scattering layer; and
a color filter layer disposed between the protection layer and the first scattering layer.

* * * * *